US010497643B1

(12) United States Patent
Gurrum et al.

(10) Patent No.: US 10,497,643 B1
(45) Date of Patent: Dec. 3, 2019

(54) PATTERNED DIE PAD FOR PACKAGED VERTICAL SEMICONDUCTOR DEVICES

(71) Applicant: Texas Instruments Incorporated, Dallas, TX (US)

(72) Inventors: Siva Prakash Gurrum, Allen, TX (US); Manu J Prakuzhy, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/973,917

(22) Filed: May 8, 2018

(51) Int. Cl.
*H01L 23/495* (2006.01)
*H01L 23/00* (2006.01)
*H01L 21/48* (2006.01)
H01L 29/78 (2006.01)
H01L 29/739 (2006.01)

(52) U.S. Cl.
CPC .... *H01L 23/49503* (2013.01); *H01L 21/4828* (2013.01); *H01L 23/49582* (2013.01); *H01L 24/48* (2013.01); *H01L 24/83* (2013.01); H01L 29/7395 (2013.01); H01L 29/7802 (2013.01); H01L 2224/48247 (2013.01); H01L 2224/83385 (2013.01); H01L 2224/83815 (2013.01)

(58) Field of Classification Search
CPC .............. H01L 24/49; H01L 23/49582
See application file for complete search history.

(56) References Cited

U.S. PATENT DOCUMENTS

| 8,330,270 B1 | 12/2012 | Lin et al. |
| 9,214,415 B2 | 12/2015 | Denison et al. |
| 2010/0148325 A1* | 6/2010 | Gruenhagen ..... H01L 23/49513 257/666 |
| 2013/0015577 A1* | 1/2013 | Pagaila ............... H01L 21/4832 257/737 |
| 2017/0317060 A1 | 11/2017 | Ziglioli |

* cited by examiner

*Primary Examiner* — Thomas L Dickey
(74) *Attorney, Agent, or Firm* — Ronald O. Neerings; Charles A. Brill; Frank D. Cimino

(57) ABSTRACT

A method of semiconductor device packaging to form a packaged semiconductor device includes providing (i) a vertical power semiconductor device die including a semiconductor substrate including a control node, a source or emitter on a top side or on a bottom side of the substrate, and a drain or a collector on another of the top side the bottom side, a backside metal (BSM) layer on the bottom side, and (ii) a leadframe. The leadframe includes a patterned die pad that includes a common continuous base portion and a two-dimensional array of spaced apart posts extending up from the base portion, with a separate solder cap on a top of the posts. The BSM layer is placed on the solder caps, and reflow processing bonds the BSM layer to the solder caps.

19 Claims, 2 Drawing Sheets

PATTERNED DIE PAD FOR PACKAGED VERTICAL SEMICONDUCTOR DEVICES

FIELD

This Disclosure relates to the packaging of vertical current flow power semiconductor devices.

BACKGROUND

Some packaged power semiconductor device die in operation utilize vertical current flow through the semiconductor substrate (e.g., silicon) to a drain (or source) contact on the bottom side of the die and then through the die pad which can be exposed for electrical contact and enhanced cooling under the semiconductor substrate. The current path can also be from a non-exposed die pad out to a substrate pin, such as using a bond wire from the die pad to the substrate pin. There can be other ways to bring an electrically conductive path from the die pad to the outside of the package, such as bond wires or fusing some leads to the die pad itself. For example, the vertical power semiconductor device die can comprise a metal-oxide-semiconductor field-effect transistor (MOSFET) generally comprising either a planar gate or a trench gate, a vertical bipolar device, or an insulated-gate bipolar transistor (IGBT).

The die attach material being in series in a current flow path of the device is important in this power device arrangement and thus needs to be electrically conductive. Due to material and process limitations, this electrically conductive die attach material, such as solder or metal (e.g., silver) filled epoxy, or a sintered material (e.g., a silver sintered material or a copper sintered material) can crack or delaminate, including during reliability testing which involves thermal cycling.

Thermal cycling can involve the device subjected to alternating environments of high temperature (e.g., 150° C.) and cold temperature (−65° C.), and can also go through power cycling, where the device is allowed to be turned on and off repeatedly. In the case of a packaged power MOSFET, damage to the conductive die attach material can cause an increase in the both the device's ON resistance (RDSon) and the conductive die attach materials thermal resistance. Such an RDSon increase can cause higher power dissipation, resulting in temperatures above allowable reliable limits, and can eventually cause an electrical failure of the device.

SUMMARY

This Summary is provided to introduce a brief selection of disclosed concepts in a simplified form that are further described below in the Detailed Description including the drawings provided. This Summary is not intended to limit the claimed subject matter's scope.

Disclosed patterned die pads for packaged vertical semiconductor power devices solve the problem of vertical current flow induced electrical performance drift of the device during thermal cycling because of die attach (e.g., solder, filled epoxy die attach, or sintered materials) damage by creating a two-dimensional array of low stress joints referred to herein as 'posts', each post including a solder cap. The array of posts that can be etched from a conventional continuous leadframe die pad that has a conventional uniform die pad thickness, and then the posts can each be capped with solder.

For example, the posts can be formed by a leadframe etching process, and the solder on the posts can be deposited using solder printing or plating, and the back side die attachment through a reflow process. The posts being smaller in area as compared to a conventional continuous leadframe pad having a uniform pad thickness reduces the die attach material cracking risk as compared to conventional solder joints as evidenced through simulations performed.

Disclosed arrangements can utilize lead-free alloys for the solder caps, such as SAC305 which contains 96.5% tin, 3% silver, and 0.5% copper, and does not need any advanced development of materials. A significant design feature herein is to create small enough post areas to reduce cracking risk while still being manufacturable, such as 25 μm to 1 mm diameter posts.

BRIEF DESCRIPTION OF THE DRAWINGS

Reference will now be made to the accompanying drawings, which are not necessarily drawn to scale, wherein.

DETAILED DESCRIPTION

Figure 1A:
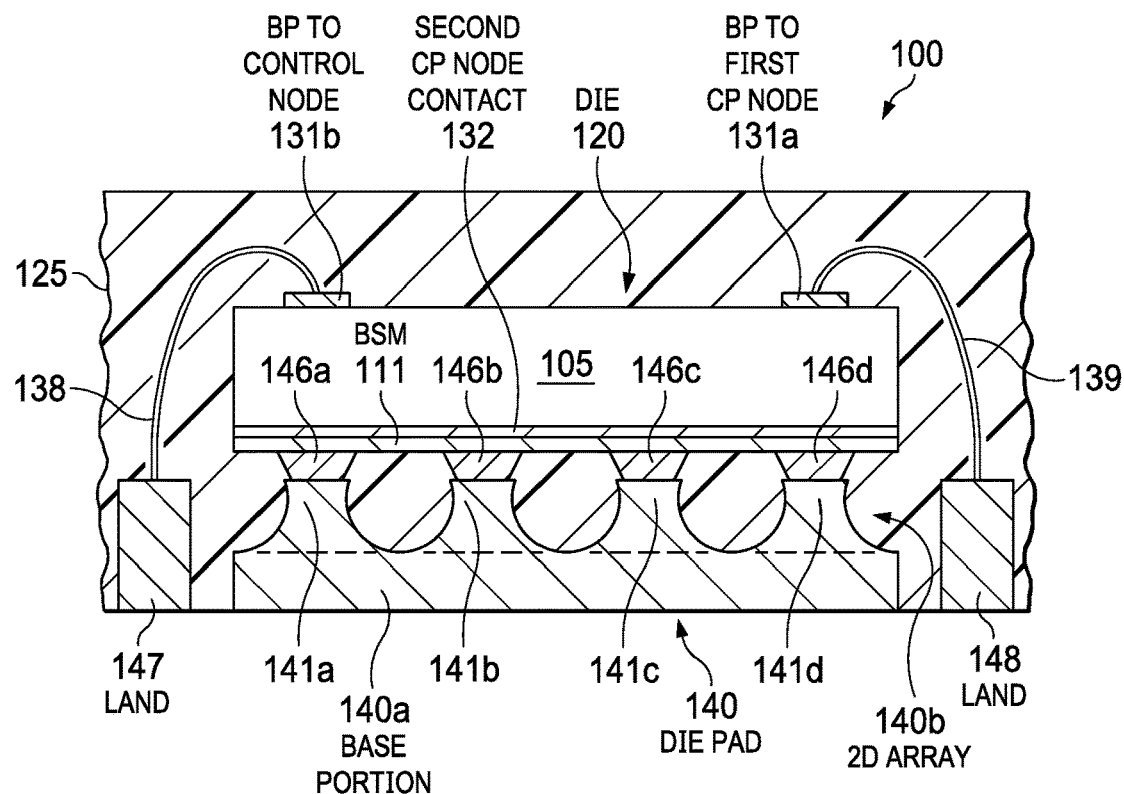
FIG. 1A is cross sectional depiction of a packaged semiconductor device including a vertical power semiconductor die comprising a semiconductor substrate on a patterned die pad that comprises a common continuous base portion and a two-dimensional array of spaced apart posts extending up from the base portion, with a separate solder cap on a top of the posts.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A is cross sectional depiction of a packaged semiconductor device 100 including a vertical power semiconductor die 120 comprising a semiconductor substrate 105. The vertical power semiconductor die 120 includes a control node (e.g., a gate for MOS device or a base for a bipolar device) shown with a bond pad (BP) 131b that is coupled to the control node, a source or an emitter on a top side of the die shown as a BP 131a to a first current path (CP) node, which can alternatively be on a bottom side of the substrate 105, and a drain or a collector on the other of the top side and the bottom side shown as a second CP node contact 132 on the bottom side. The vertical power semiconductor die 120 can comprise a MOS device generally comprising either a planar gate or a trench gate device, a vertical bipolar device, or an IGBT.

Figure 2:
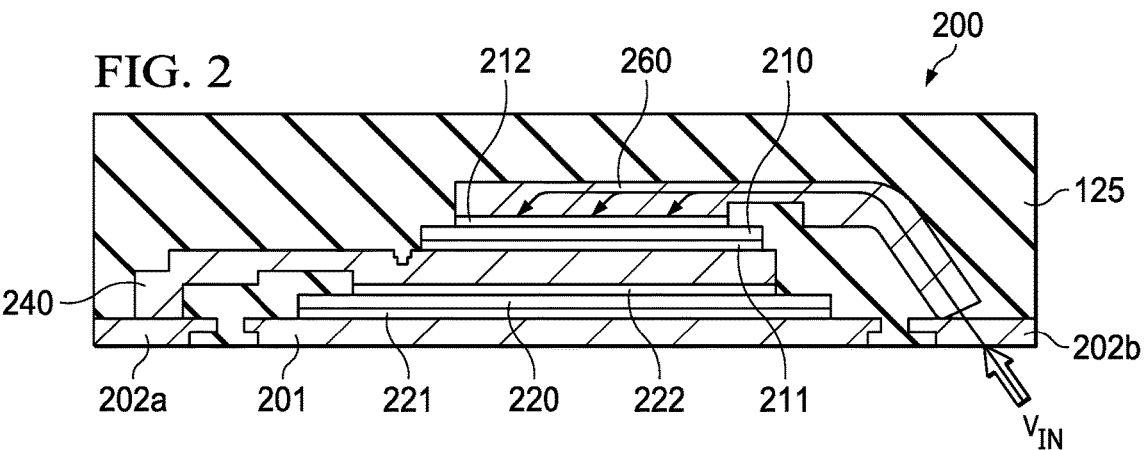
FIG. 2 shows an example clip Quad Flat No-lead (QFN) device that can benefit from a disclosed patterned die pad.

A backside metal (BSM) layer 111 is on the bottom side of the die on a patterned die pad 140 that comprises a common continuous base portion 140a and a two-dimensional array 140*b* of spaced apart posts shown as 141*a*, 141*b*, 141*c*, and 141*d* extending up from the base portion 140*a*, with a separate solder cap 146*a*, 146*b*, 146*c*, and 146*d* on a top of each of the posts. The BSM layer 111 can comprise silver which is generally a good candidate to connect to solder, but there can be other metals between silicon and silver to create good adhesion and a stable structure. The solder caps 146*a*, 146*b*, 146*c*, and 146*d* are shown lamp shade-shaped having a wider base and narrower top with curved sidewalls. Although not shown in FIG. 1A the solder caps 146*a*, 146*b*, 146*c*, and 146*d* can be offset (i.e., misaligned) relative to the top of the posts 141*a*, 141*b*. The solder cap 146*a*, 146*b*, 146*c*, and 146*d* thickness is generally 5 to 100 µm, such as 5 to 50 µm. Bond wires 138, 139 are shown making connections between the BP 131*b* and BP 131*a* on the top side of the vertical power semiconductor die 120 to respective QFN perimeter lands shown as 147 and 148. As an alternative to the bond wires and perimeter lands as shown in FIG. 1A, clips can be used, such as shown in FIG. 2 described below. A molding material 125, such as a filler particle filled epoxy, is around the die 120 and the patterned die pad 140.

Figure 1B:
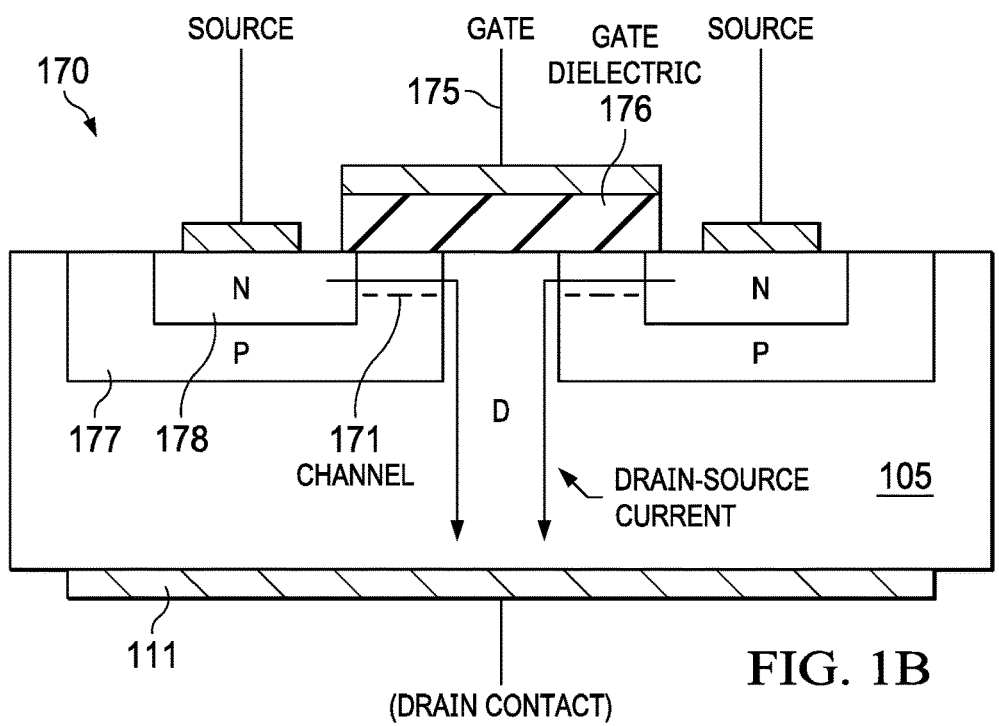
FIG. 1B is a cross sectional depiction of a basic example vertical current flow power MOSFET device that can be the vertical power semiconductor die shown in FIG. 1A.

FIG. 1B is a cross section depiction of a basic example vertical current flow power MOSFET device 170 that can be the vertical power semiconductor die 120 in FIG. 1A. The actual structures of a real power MOSFET is generally more complex and includes a variety of other structures including trenches, such as for the gate or for field plates. The MOSFET device 170 includes an N+ source 178 formed in a pwell 177 that is formed in a substrate 105.

The drain for the MOSFET device 170 shown as D is from the center region under the gate electrode 175 on a gate dielectric 176 to the bottom of the die having the BSM layer 111 thereon. The channel 171 shown is horizontal under the gate electrode 175 on gate dielectric 176, but it is shorter as compared to a conventional MOSFET, and the current flow shown between channel 171 and the drain contact at the BSM layer 111 is vertical. The short channel 171 provided means a low ON resistance, a property of power devices.

The solder caps 146*a*, 146*b*, 146*c*, and 146*d* can be formed using solder paste that can be printed using stencil, or can be plated on the posts and reflowed. The reflow processing to bond the BSM layer 111 to the solder caps may use, for example, a peak temperature of about 260° C. for tin-silver-copper (SnAgCu, 'SAC') alloys. The solder caps can be connected to the BSM layer 111 and the leadframe during reflow, although other flows are possible with plated solder. The solder generally forms an intermetallic connection with BSM layer 111 and the posts. The process can be performed in a variety of ways. For example, solder plated on posts, solder printed on posts, solder printed on a BSM layer (using flipped die), solder plated on a BSM layer. In all cases, the final step does include a reflow process (melting temperature of solder) to create a connection with the other surface.

Disclosed methods of semiconductor device packaging generally utilize a copper (Cu) panel substrate which forms the raw material of a leadframe strip. The panel substrate is subjected to a selective wet etch process so that the process described above is carried out in the simultaneous fabrication of several units.

Raw material of the leadframe strip is generally coated with a layer of photo-imagable solder mask, such as a photo-imagable epoxy by spin coating the solder mask. The layer of photo-imagable etch-resist mask is then imaged with a photolithography tool. This is generally accomplished by exposure of the photo-imagable mask to ultraviolet light masked by the photo-tool and subsequent developing of the solder mask. The photo-imagable mask is thereby patterned to provide pits in which the upper and lower surfaces of the leadframe strip are exposed. Thus, the leadframe strip is selectively masked with the photo-imagable mask.

The leadframe strip is then etched by, for example, immersion or pressurized spray etching, and the photo-imagable mask is stripped away to provide a disclosed patterned leadframe. This process can be a standard etched leadframe process (half-etch) for QFN leadframes. The resulting leadframe strip includes a plurality of units, where each unit includes a generally centrally located patterned die attach pad. The die attach pad includes a continuous portion on one side of the die attach pad and the plurality of posts that extend from the continuous portion, to the opposite side of the die attach pad. Each unit also includes the plurality of contact pads (or leads) that circumscribe the die attach pad. There will be connections from top of die to these leads using bond wires as one example.

FIG. 2 shows an example clip QFN power converter device 200 that can benefit from a disclosed patterned die pad. A control MOS field effect transistor (FET) 210 is stacked upon a synchronous (sync) MOSFET 220. The control FET chip 210 can have a smaller area relative to sync FET chip 220. A QFN metal leadframe has a generally rectangular shaped disclosed patterned die pad 201 destined to become the heat spreader of this clip QFN power converter device 200. The leads 202*a* and 202*b* are positioned in line along two opposite sides of the patterned die pad 201. The die pad 201 can be a patterned die pad as disclosed herein. The other pad sides may be kept free of leads. The stacking of the FET chips is accomplished by the so-called source-down configuration.

The source of sync FET 220 is soldered to the patterned die pad 201 by a solder layer 221. A first clip 240 is soldered by solder layer 222 onto the drain of the sync FET 220, which has the source of control FET 210 attached by a solder layer 211. The first clip 240 thus serves as the switch node terminal of the power converter. A second clip 260 is connected by a solder layer 212 to the drain of control FET 210. The first and second clip 240, 260 can be a patterned clip as disclosed herein. The second clip 260 is attached to lead 202*b* of the leadframe and thus connected to the input supply voltage shown as $V_{IN}$. This power converter device 200 may operate efficiently at a frequency of 500 kHz up to about 5 MHz.

Advantages of disclosed patterned die pads include enabling a simple Pb-free die attached solution without using any new processes. The die pad etching to form the posts can be part of standard leadframe half-etch process. Standard printing and reflow processing can be used to attach a silicon die with BSM layer 111. Although a potential disadvantage of disclosed patterned die pads having a reduced area connection to the BSM layer 111 of the die is higher series resistance as compared to uniform (unpatterned) die pads that use a silver filled epoxy die attach material, solder caps have a 25° C. resistivity of about 15µ-ohm-cm, compared to silver filled epoxy that has a 25° C. resistivity generally greater than 50µ-ohm-cm. Additionally, the solder cap thickness can as described above be in the 5 to 25 µm range, compared to epoxy generally needing at least about 50 µm. Therefore, is no significant resistance increase expected when implementing a disclosed patterned die pad.

EXAMPLES

Disclosed embodiments of the invention are further illustrated by the following specific Examples, which should not be construed as limiting the scope or content of this Disclosure in any way.

Figure 3:
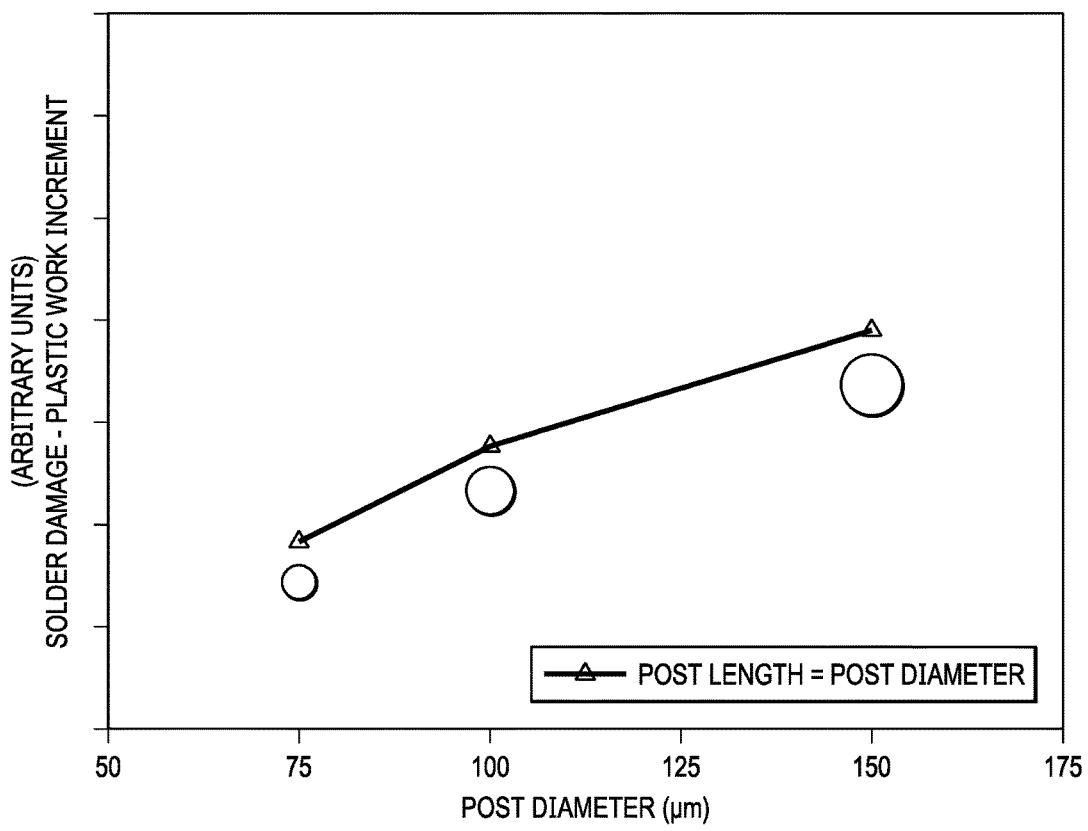
FIG. 3 shows results from simulations on flip-chip-on-lead devices showing solder damage as a plastic work increment (arbitrary units) vs. post diameter (in plm) as a function of die pad post diameter. In these simulations the posts were patterned on the silicon die.

FIG. 3 shows results from simulations on flip-chip-on-lead devices showing solder damage from a plastic work increment (in MPa) vs. post diameter (in µm) as a function of die pad copper post size and shape. A lower plastic work increment is better. Stress reduction is believed to be realized due to reduced die pad contact area to the BSM layer 111 of the die resulting from the posts spanning a reduced area as compared to a conventional unpatterned die pad. This leads to less impact from a Coefficient of Thermal Expansion (CTE) mismatch, such as between a silicon die and a copper die pad.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure. For example, disclosed aspects can also be applied to simple switches which turn on and conduct DC current.

The invention claimed is:

1. A method of semiconductor device packaging, comprising:
providing (i) a vertical power semiconductor device die comprising a semiconductor substrate including a control node, a source or emitter on a top side or on a bottom side of the substrate, and a drain or a collector on another of the top side and the bottom side, a backside metal (BSM) layer on the bottom side, and (ii) a leadframe including a patterned die pad that comprises a common continuous base portion and a two-dimensional array of spaced apart posts extending up from the of base portion, with a separate solder cap on a top of the posts;
placing the BSM layer on the solder caps; and
reflow processing to bond the BSM layer to the solder caps.

2. The method of claim 1, wherein a thickness of the solder caps is 5 to 50 µm.

3. The method of claim 1, wherein the top of the posts is narrower as compared to a bottom of the posts.

4. The method of claim 3, wherein a sidewall of the posts is curved.

5. The method of claim 1, wherein the vertical power semiconductor device die comprises a metal-oxide-semiconductor field-effect transistor (MOSFET).

6. The method of claim 1, wherein the solder caps comprise a Pb-free solder composition.

7. The method of claim 1, further comprising etching an unpatterned die pad to form the patterned die pad and solder printing the solder cap on the posts.

8. The method of claim 7, wherein the etching comprises a half-etch process.

9. The method of claim 1, wherein the leadframe comprises a plurality of lead fingers or perimeter lands, further comprising placing bond wires between bond pads connected to nodes on the vertical power semiconductor device die to the plurality of lead fingers or perimeter lands.

10. The method of claim 1, wherein the semiconductor substrate comprises silicon and the die pad comprises copper.

11. A packaged semiconductor device, comprising:
a vertical power semiconductor die comprising a semiconductor substrate including a control node, a source or emitter on a top side or on a bottom side of the substrate, and a drain or a collector on another of the top side and the bottom side, and a backside metal (BSM) layer on the bottom side;
a leadframe including a patterned die pad that comprises a common continuous base portion and a two-dimensional array of spaced apart posts extending up from the of base portion, with a separate solder cap on a top of the posts,
wherein the BSM layer is bonded to the solder caps.

12. The packaged semiconductor device of claim 11, wherein the solder caps comprise a Pb-free composition.

13. The packaged semiconductor device of claim 11, wherein a thickness of the solder caps is 5 to 50 µm.

14. The packaged semiconductor device of claim 11, wherein the top of the posts is narrower as compared to a bottom of the posts.

15. The packaged semiconductor device of claim 11, wherein a sidewall of the posts is curved.

16. The packaged semiconductor device of claim 11, wherein the semiconductor substrate comprises silicon and the die pad comprises copper.

17. A method of semiconductor device packaging, comprising:
providing (i) a vertical power semiconductor device die comprising a semiconductor substrate including a control node, a source or emitter on a top side or on a bottom side of the substrate, and a drain or a collector on another of the top side and the bottom side, a backside metal (BSM) layer on the bottom side, and (ii) a leadframe including a patterned die pad that comprises a common continuous base portion and a two-dimensional array of spaced apart posts extending up from the base portion, with a separate solder cap on a top of the posts, wherein a total area at the top of the posts exclusive of the solder caps is 10% to 70% of an area of the base portion;
placing the BSM layer on the solder caps; and
reflow processing to bond the BSM layer to the solder caps.

18. A quad-flat no-leads (QFN) package, comprising:
a vertical power semiconductor die comprising a semiconductor substrate including a control node, a source or emitter on a top side or on a bottom side of the substrate, and a drain or a collector on another of the too side and the bottom side, and a backside metal (BSM) layer on the bottom side;
a leadframe including a patterned die pad that comprises a common continuous base portion and a two-dimensional array of spaced apart posts extending up from the base portion, with a separate solder cap on a top of the posts, wherein the BSM layer is bonded to the solder caps; and
bond wires between bond pads on a top side of the vertical power semiconductor die coupling to perimeter lands of the QFN package.

19. A clip quad-flat no-lead (QFN) device including clips, comprising:
a vertical power semiconductor die comprising a semiconductor substrate including a control node, a source or emitter on a too side or on a bottom side of the substrate, and a drain or a collector on another of the top side and the bottom side, and a backside metal (BSM) layer on the bottom side;

a leadframe including a patterned die pad that comprises a common continuous base portion and a two-dimensional array of spaced apart posts extending up from the base portion, with a separate solder cap on a top of the posts, wherein the BSM layer is bonded to the solder caps.

* * * * *